(12) United States Patent
Iuliano et al.

(10) Patent No.: US 11,303,478 B2
(45) Date of Patent: Apr. 12, 2022

(54) DATA-ENABLE MASK COMPRESSION ON A COMMUNICATION BUS

(71) Applicant: Apple Inc., Cupertino, CA (US)

(72) Inventors: Luca O. Iuliano, Chesham (GB);
Doron Rajwan, Rishon Lezio (IL); Ali Rabbani Rankouhi, Bushey (GB)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 17/164,482

(22) Filed: Feb. 1, 2021

(65) Prior Publication Data

US 2021/0320826 A1    Oct. 14, 2021

Related U.S. Application Data

(63) Continuation of application No. 16/845,865, filed on Apr. 10, 2020, now Pat. No. 10,911,267.

(51) Int. Cl.
*H04L 25/02* (2006.01)
*H04L 1/00* (2006.01)
*H04L 25/49* (2006.01)

(52) U.S. Cl.
CPC ........ *H04L 25/0272* (2013.01); *H04L 1/0041* (2013.01); *H04L 1/0057* (2013.01); *H04L 25/4917* (2013.01)

(58) Field of Classification Search
CPC ............ H04L 25/0272; H04L 25/4917; H04L 1/0041; H04L 1/0057; H03M 7/3066; H03M 7/6023; Y02D 10/00; G06F 13/385

(Continued)

(56) References Cited

U.S. PATENT DOCUMENTS 6,151,239 A    11/2000 Batra
7,643,505 B1    1/2010 Colloff
(Continued)

FOREIGN PATENT DOCUMENTS

CN    101689863 A    3/2010
CN    107003851 A    8/2017
(Continued)

OTHER PUBLICATIONS

Extended European Search Report in Appl. No. 21167841.2 dated Aug. 17, 2021, 14 pages.

(Continued)

*Primary Examiner* — Khai M Nguyen
(74) *Attorney, Agent, or Firm* — Kowert, Hood, Munyon, Rankin & Goetzel, P.C.

(57) ABSTRACT

An apparatus includes a decoding circuit, and a communication bus that is configured to transfer a particular data payload and a control signal that indicates whether the particular data payload includes a mask value. The mask value is indicative of enabled and non-enabled data words in the particular data payload. The decoding circuit is configured to receive, from an encoding circuit via the communication bus, the particular data payload and the control signal. In response to a determination that the control signal indicates that the particular data payload does not include the mask value, the decoding circuit is configured to use a default value for the mask value, and to create an uncompressed data payload from the particular data payload using the default value, wherein the default value causes the (Continued)

decoding circuit to maintain positions of data words between the particular data payload and the uncompressed data payload.

20 Claims, 11 Drawing Sheets

(58) Field of Classification Search
USPC .............................................. 341/56, 58, 87
See application file for complete search history.

(56) References Cited

U.S. PATENT DOCUMENTS

| | | | |
|---|---|---|---|
| 8,307,270 | B2 | 11/2012 | Kim et al. |
| 8,321,640 | B2 | 11/2012 | Kwak et al. |
| 9,916,251 | B2 | 3/2018 | Jung et al. |
| 10,177,782 | B2 * | 1/2019 | Satpathy ............. H03M 7/4037 |
| 10,540,304 | B2 * | 1/2020 | Sadowski ........... G06F 13/4204 |
| 2008/0043757 | A1 | 2/2008 | Dielissen |
| 2018/0067679 | A1 | 3/2018 | Adrianus Heddes et al. |
| 2019/0146910 | A1 | 5/2019 | Cho et al. |

FOREIGN PATENT DOCUMENTS

| | | |
|---|---|---|
| CN | 107220027 A | 9/2017 |
| CN | 108702160 A | 10/2018 |
| CN | 109661780 A | 4/2019 |
| CN | 109783008 A | 5/2019 |
| EP | 3404867 | 11/2018 |
| GB | 2447494 A | 9/2008 |
| KR | 20130122789 A | 11/2013 |
| WO | 2017/131578 A1 | 8/2017 |

OTHER PUBLICATIONS

Anonymous: Bus (computing) Wikipedia, Mar. 20, 2020 (Mar. 20, 2020), pp. 1-11, XP055828891, Retrieved from the Internet: URL:https://en.wikipedia.org/w/index.php?title=Bus_(computing)&oldid=946465698 [retrieved on Jul. 29, 2021].

Office Action in CN Appl. No. 202110366717.8 dated Feb. 9, 2022, 5 pages.

\* cited by examiner

DATA-ENABLE MASK COMPRESSION ON A COMMUNICATION BUS

The present application is a continuation of U.S. application Ser. No. 16/845,865, filed Apr. 10, 2020 (now U.S. Pat. No. 10,911,267). The disclosure of the above-referenced application is incorporated by reference herein in its entirety.

BACKGROUND

Technical Field

Embodiments described herein are related to the field of integrated circuits, and more particularly to data communication on a communication bus.

Description of the Related Art

Communication buses in a computer system may include many conductive wires or traces for transferring multiple data words in parallel between two or more functional circuits. A data payload corresponds to a set of data words that can be transferred in parallel on a communication bus. In some instances, however, a number of data words to be sent in a single data payload may be less than a maximum number of data words that the communication bus is capable of transferring. In such instances, a mask value can be utilized to indicate to a functional circuit receiving the data payload which data words are enabled and which data words are not enabled.

SUMMARY OF THE EMBODIMENTS

Broadly speaking, apparatus and methods are contemplated in which an apparatus includes an encoding circuit, and a communication bus having conductive traces that are configured to transfer a data payload, including a control signal and up to a maximum number of data words. The encoding circuit is configured to receive an uncompressed data payload and a mask value, and to create, using the mask value, the control signal. The control signal is indicative of whether the uncompressed data payload includes one or more non-enabled data words. In response to a determination that the control signal indicates that the uncompressed data payload includes one or more non-enabled data words, the encoding circuit is configured to create a compressed data payload from the uncompressed data payload, and to send, to a decoding circuit, the compressed data payload and the control signal via the plurality of conductive traces of the communication bus. The compressed data payload includes the mask value.

In a further example, each data word of the uncompressed data payload may be placed into a respective position within the uncompressed data payload. To create the compressed data payload, the encoding circuit is configured to move a particular enabled data word from a particular position in the uncompressed data payload to a different position in the compressed data payload.

In one example, to create the compressed data payload, the encoding circuit is further configured to shift enabled data words from less significant positions in the uncompressed data payload to more significant positions in the compressed data payload until a non-enabled data word is reached. In another example, to create the compressed data payload, the encoding circuit is further configured to place the mask value into a least significant position of the compressed data payload.

In an embodiment, the encoding circuit is further configured, in response to a determination that the control signal indicates that all data words included in the uncompressed data payload are enabled data words, to create the compressed data payload from the uncompressed data payload. The compressed data payload does not include the mask value. The encoding circuit is further configured to send, to the decoding circuit, the compressed data payload and the control signal via the plurality of conductive traces of the communication bus without including the mask value.

In one example, the encoding circuit may send the control signal over a single conductive trace by asserting the control signal when at least one data word is non-enabled, and otherwise de-asserting the control signal. In a further example, each bit of the mask value may correspond to one respective data word position in the uncompressed data payload.

BRIEF DESCRIPTION OF THE DRAWINGS

The following detailed description makes reference to the accompanying drawings, which are now briefly described.

Figure 1:
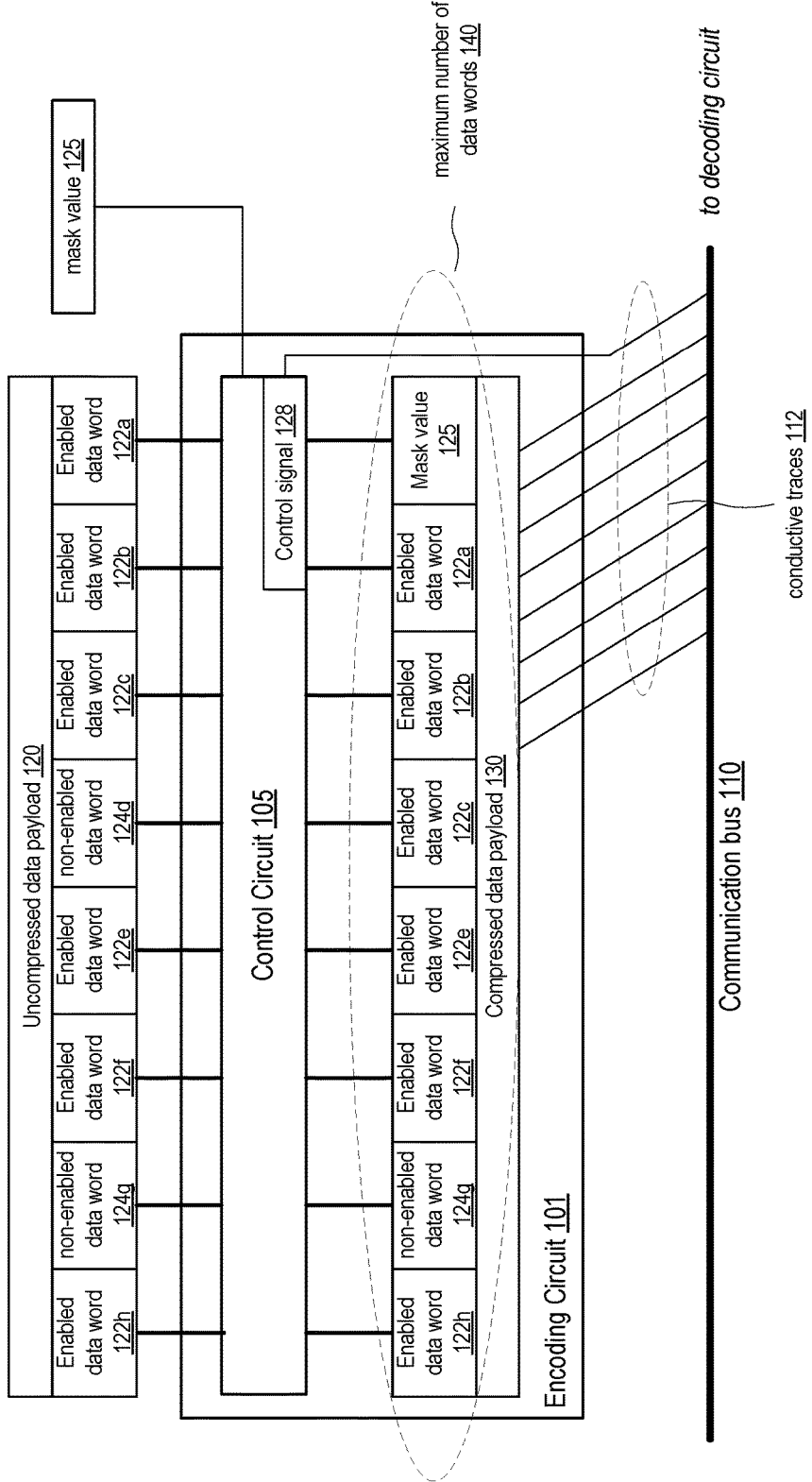
FIG. 1 illustrates a block diagram of an embodiment of a computing device that includes an encoding circuit.

While the disclosure is susceptible to various modifications and alternative forms, specific embodiments thereof are shown by way of example in the drawings and will herein be described in detail. It should be understood, however, that the drawings and detailed description thereto are not intended to limit the disclosure to the particular form illustrated, but on the contrary, the intention is to cover all modifications, equivalents and alternatives falling within the spirit and scope of the present disclosure as defined by the appended claims. As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. § 112, paragraph (f) interpretation for that unit/circuit/component. More generally, the recitation of any element is expressly intended not to invoke 35 U.S.C. § 112, paragraph (f) interpretation for that element unless the language "means for" or "step for" is specifically recited.

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. The phrase "based on" is thus synonymous with the phrase "based at least in part on."

DETAILED DESCRIPTION OF EMBODIMENTS

To transfer information between two or more functional circuits, a computing device may include one or more communication buses. Such communication buses commonly include many conductive wires or traces for transferring, in parallel, data payloads that include multiple data words. Transferring the information in parallel may result in the information reaching its destination more quickly than if the information was sent serially. As used herein, a "data payload" is a set of one or more data words intended to be transferred in parallel on the communication bus. Additionally, a "data word" is a number of bits of information that are grouped together and manipulated by communication bus circuits as a single unit. In various embodiments, a data word may include any number of bits, such as an eight-bit byte, a 16-bit word, 32-bit word, or any other suitable size.

In some cases, a number of data words to be sent in a single data payload may be less than a maximum number of data words that the communication bus is capable of transferring. For example, a communication bus may include 128 conductive traces for transferring eight 16-bit data words in parallel. Such a communication bus may be utilized to transfer data payloads with fewer than eight data words, e.g., 5 data words. The five data words may be placed into any five of the eight possible data word positions of the communication bus. In such cases, a mask value can be utilized to indicate to a functional circuit receiving the data payload which five data word positions include one of the five data words being transferred (referred to as "enabled" data words), and which three data word positions are not enabled. The mask value, however, creates a need for eight additional conductive traces to send the mask value in parallel with the data payload, or for the mask value to be sent either before or after the data payload is sent, using the same 128 conductive wires that carry the data payload. The inventors have recognized a benefit of a system that allows sending of the mask value in parallel with the data payload without a need to increase to the number of conductive wires in the communication bus.

Embodiments of apparatus and methods are disclosed in which an encoding circuit is utilized to prepare a data payload for transmission on a communication bus. The communication bus is configured to transfer the data payload, including up to a maximum number of data words, and a control signal. The encoding circuit creates a control signal based on a mask value received with the data payload, the control signal indicating whether one or more data words of the data payload are not enabled. The encoding circuit creates a compressed data payload using the mask value, and includes the mask value in the compressed data payload. The single control signal is sent, via the communication bus, to a decoding circuit in parallel with the compressed data payload.

It is noted that sending data and control signals in "parallel" refers to multiple signals having valid states during a same time period, but is not intended to imply that the signals must all start and/or stop at exactly the same time. For example, circuits that send signals over respective bit lines for a data payload and for a control signal may be configured to begin sending in response to an assertion of a same control or clock signal, but due to respective circuit designs and variations in a fabrication process, the circuits may begin and/or end their respective sending at different points in time.

A block diagram for an embodiment of a computing device is illustrated in FIG. 1. As shown, computing device 100 includes encoding circuit 101 that further includes control circuit 105. Control circuit 105 is configured to receive uncompressed data payload 120 and mask value 125, and using these values, generates control signal 128 and compressed data payload 130. Compressed data payload 130 and control signal 128 are sent to a decoding circuit via communication bus 110. Computing device 100 may be a mobile, desktop, or any suitable type of computing device, such as a desktop computer, laptop computer, smartphone, tablet, wearable device, and the like. In some embodiments, computing device 100 may be implemented on a system-on-chip (SoC) or other type of integrated circuit (IC).

As illustrated, computing device includes communication bus 110 that transfers information between two or more functional circuits, one of which includes encoding circuit 101, coupled to communication bus 110. Communication bus 110 has a plurality of conductive traces 112 that are configured to transfer a data payload, such as compressed data payload 130, that includes up to a maximum number of data words, and control signal 128. As used herein, a "conductive trace" refers to a metallic substance coupled between two or more circuits to conduct electronic signals between the two or more circuits. For example, conductive traces 112 may be implemented as metal lines created in one or more layers of an IC and/or metal etchings on one or more circuit boards, and/or as a plurality of wires in a cable coupled between two or more circuit boards. A number of conductive traces 112 of communication bus 110 corresponds to a number of bits included in the maximum number of data words in a data payload plus control signal 128. To send compressed data payload 130 via communication bus 110, encoder circuit 101 is configured to send all bits of compressed data payload 130 and control signal 128 in parallel.

Encoding circuit 101, as shown, is configured to receive uncompressed data payload 120 and mask value 125. Mask value 125 indicates enabled and non-enabled data words in uncompressed data payload 120. As used herein, an "enabled data word" refers to a data word included in a data payload that represents valid data to be sent and received by functional circuits. In a similar manner, a "non-enabled data word" refers to data included in the data payload that is not valid, but instead used as a place holder within the data payload. Whether non-enabled data words are sent between functional circuits is irrelevant except to maintain a placement of data words in the data payload as desired. For example, the functional circuit of computing device 100 that includes encoding circuit 101 has six data words to send to another functional circuit. As shown, communication bus 110 is capable of transmitting eight data words in parallel. The six data words to be sent are arranged in uncompressed data payload 120 in a particular order, such that two non-enabled data words are interspersed with the six data words to be sent. Uncompressed data payload 120, therefore, has six enabled data words (122h, 122f, 122e, 122c, 122b, and 122a) and two non-enabled data words (124g and 124d). Non-enabled data words 124d and 124g are used to maintain an order of the enabled data words.

Mask value 125 includes a number of bits for indicating which data word positions in uncompressed data payload 120 are enabled and which are not enabled. A total number of bits included in mask value 125 does not exceed the number of bits in a data word. Accordingly, if a data word is one byte, then mask value 125 does not exceed a size of one byte. The bits in mask value 125 may be utilized in any suitable fashion for indicating which data words of a given data payload are enabled. For example, each bit of mask value 125 may correspond to one respective data word position in uncompressed data payload 120, with a logic value of '1' indicating an enabled data word and vice versa. In other embodiments, two or more bits of mask value 125 may be used to indicate additional information about each data word. For example, two bits may be used such that a value of '00' indicates a non-enabled data word, '01' indicates an enabled data word that includes a command, '10' indicates an enabled data word that includes an address, and '11' indicates an enabled data word that includes data. Additional methods for encoding mask value 125 are contemplated.

As illustrated, control circuit 105 in encoding circuit 101 is configured to create, using mask value 125, control signal 128. Control signal 128 indicates whether uncompressed data payload 120 includes one or more non-enabled data words. Uncompressed data payload 120 includes both non-enabled data words 124g and 124d, and control signal 128 is generated to indicate the presence of these two non-enabled data words. For example, control circuit 105 asserts a logic value in response to a determination that control signal 128 indicates that uncompressed data payload 120 includes the one or more non-enabled data words, encoding circuit 101 creates compressed data payload 130 from uncompressed data payload 120. Compressed data payload 130 also includes mask value 125.

To create compressed data payload 130, control circuit 105 uses mask value 125 to identify a non-enabled data word in uncompressed data payload 120 (in the illustrated example, non-enabled data word 124d), and shift the positions of enabled data words 122a-122c, thereby making a position available for adding mask value 125 to compressed data payload 130. Encoding circuit 101 is further configured to send, to a decoding circuit, compressed data payload 130 and control signal 128 via the plurality of conductive traces 112 of communication bus 110.

By compressing the received data payload and adding mask value 125 to create compressed data payload 130, only a single additional conductive trace is added for sending control signal 128 to the decoding circuit. If uncompressed data payload 120 is sent via communication bus 110, then a plurality of conductive traces 112 would need to be added, one for each bit of mask value 125. Routing of additional conductive traces may consume die area on an IC and/or board area on a circuit board. In addition, each additional conductive trace would further include a driver circuit that sources or sinks current on the additional conductive trace to generate a respective logic value, thereby potentially increasing power consumption of computing device 100. Accordingly, reducing a number of conductive traces may reduce die and/or circuit board area as well as reducing power consumption.

Encoding circuit 101, as shown, is further configured, in response to a determination that the control signal indicates that all data words included in uncompressed data payload 120 are enabled data words, to create compressed data payload 130 from uncompressed data payload 120, wherein compressed data payload 130 does not include mask value 125. To create compressed data payload 130, encoding circuit 101 transfers all data words included in uncompressed data payload 120 into compressed data payload 130. Encoding circuit 101 is further configured to send, to the decoding circuit, compressed data payload 130 and control signal 128 via conductive traces 112 of communication bus 110 without including mask value 125. Since all data word positions are enabled, encoding circuit 101 omits sending of mask value 125. The state of control signal 128 will indicate to the decoding circuit that all data word positions are enabled.

It is noted that computing device 100 as illustrated in FIG. 1 is merely an example. The illustration of FIG. 1 has been simplified to highlight features relevant to this disclosure. Various embodiments may include different configurations of the circuit blocks, including a different number of data words in the uncompressed and compressed data payloads. In some embodiments, a plurality of encoding circuits may be implemented in a functional circuit to compress larger sizes of data payloads, with each encoding circuit compressing a respective portion of the larger data payload.

The encoding circuit illustrated in FIG. 1 is described as sending the compressed data payload to a decoding circuit. An example of a decoding circuit is shown in FIG. 2.

Figure 2:
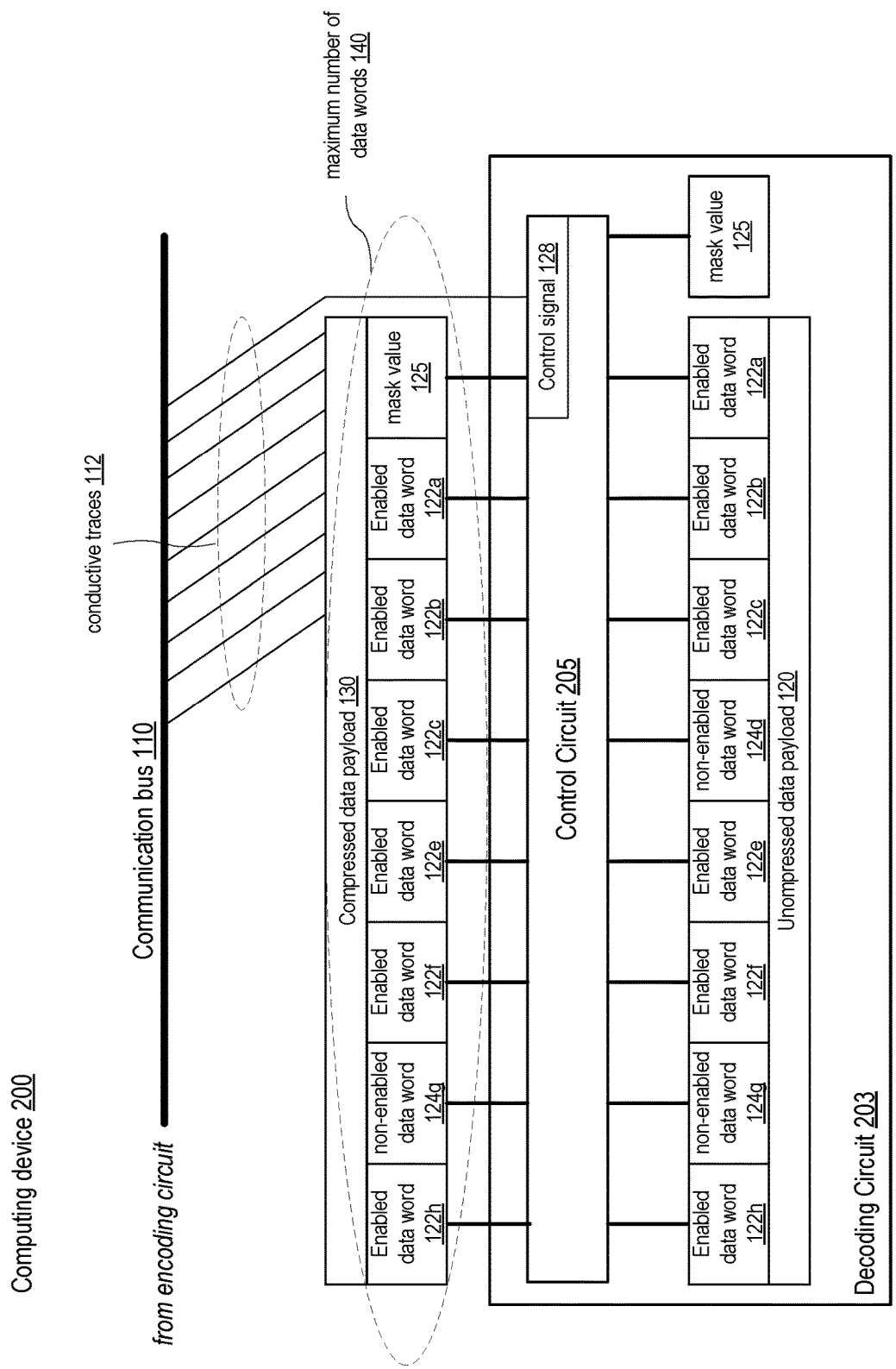
FIG. 2 shows a block diagram of an embodiment of a computing device that includes a decoding circuit.

Moving to FIG. 2, a block diagram of another embodiment of a computing device is shown. As illustrated, computing device 200 includes decoding circuit 203 that further includes control circuit 205. Control circuit 205 is configured to receive compressed data payload 130 and control signal 128, and using these values, generates mask value 125 and uncompressed data payload 120. Compressed data payload 130 and control signal 128 are received from an encoding circuit (e.g., encoding circuit 101 in FIG. 1) via communication bus 110. Computing device 200 may be a mobile, desktop, or any suitable type of computing device, such as a desktop computer, laptop computer, smartphone, tablet, wearable device, and the like. In some embodiments, computing device 200 may be implemented on a systemon-chip (SoC) or other type of integrated circuit (IC). In such embodiments, computing devices 100 and 200 may be the same computing device and encoding circuit 101 and decoding circuit 203 may be implemented on the same SoC.

As illustrated, decoding circuit 203 receives data payloads from one or more encoding circuits, such as encoding circuit 101 in FIG. 1, via communication bus 110. Communication bus 110 has a plurality of conductive traces 112 that are configured to transfer a data payload that includes up to maximum number of data words 140, and control signal 128. A number of conductive traces 112 of communication bus 110 corresponds to a number of bits included in the maximum number of data words 140 plus a number of bits in control signal 128. As shown, communication bus 110 can transfer eight data words plus control signal 128. If, for example, a data word includes eight bits and control signal 128 is a single bit, then the number of conductive traces 112 is 65. In a different example, if a data word is 32 bits and the control signal is two bits, then the number of conductive traces 112 is 258. In various cases, the received data payloads may or may not be compressed. An uncompressed data payload includes a maximum number of enabled data words, while a compressed data payload includes fewer than the maximum number of enabled data words.

Decoding circuit 203 is configured to receive, from an encoding circuit via communication bus 110, compressed data payload 130 and control signal 128. Control signal 128 indicates whether compressed data payload 130 is compressed. For example, control signal 128 may be received via a single conductive trace of conductive traces 112. An asserted state of control signal 128 on the single conductive trance may indicate that compressed data payload 130, received in parallel with control signal 128, is compressed, while a de-asserted state of control signal 128 indicates that a data payload received in parallel is uncompressed. It is noted that, in some embodiments, asserted and de-asserted states correspond, respectively, to logic high and logic low states, while in other embodiments, the logic states are reversed.

In response to a determination that control signal 128 indicates that compressed data payload 130 is compressed, decoding circuit 203 is configured to extract mask value 125 from compressed data payload 130 and, using mask value 125, create uncompressed data payload 120 from compressed data payload 130. As shown, decoding circuit 203 is configured to receive the maximum number of data words, which is eight in the illustrated example. Decoding circuit 203 receives compressed data payload 130 which includes six enabled data words (enabled data words 122a-122c, 122e, 122f, and 122h), as well as non-enabled data word 124g and mask value 125. Control circuit 205, within decoding circuit 203, receives control signal 128 in parallel with compressed data payload 130. An asserted state of control signal 128 indicates that compressed data payload 130 is compressed. In response to this indication, control circuit 205 extracts mask value 125 from compressed data payload 130. For example, mask value 125 may be stored in a particular position within compressed data payload 130, and control circuit 205 reads data from the particular position and interprets this data as mask value 125.

As illustrated, mask value 125 indicates which of the remaining data words in compressed data payload 130 are enabled. Using mask value 125, control circuit 205 maps the data words that are indicated as enabled to corresponding positions in uncompressed data payload 120. Accordingly, uncompressed data payload 120 includes enabled data words 122a-122c, 122e, 122f, and 122h, with non-enabled data words 124d and 124g included to provide uncompressed data payload with the maximum number of data words 140. Decoding circuit 203 may send uncompressed data payload 120 to a particular function circuit or may store uncompressed data payload 120 for later retrieval by the particular functional circuit. While values for the enabled data words are based on the received enabled data words, values for non-enabled data words 124d and 124g may be set to a default value. In other embodiments, to reduce an amount of switching on circuits in the particular functional circuit, values for non-enabled data words 124d and 124g may be left to previous values that were used on a prior data payload.

If decoding circuit 203 receives a value of control signal 128 that indicates that a different data payload received in parallel is uncompressed, then control circuit 205 is configured to use a default value for mask value 125, rather than extract a value from the different data payload. Since, in an uncompressed data payload, all data words are enabled, mask value 125 may have a single value that is indicative of all data words being enabled. Control circuit 205 uses this single value for mask value 125 to map all data words of the different data payload into uncompressed data payload 120, which may then be utilized by the particular functional circuit.

It is noted that the embodiment of FIG. 2 is merely an example to demonstrate the disclosed concepts. In other embodiments, a different combination of circuits may be included. For example, in other embodiments, a different number of data words may be included in the compressed and uncompressed data payloads. A plurality of decoding circuits 203 may be utilized in parallel to receive larger amounts of data words in parallel.

Figure 3:
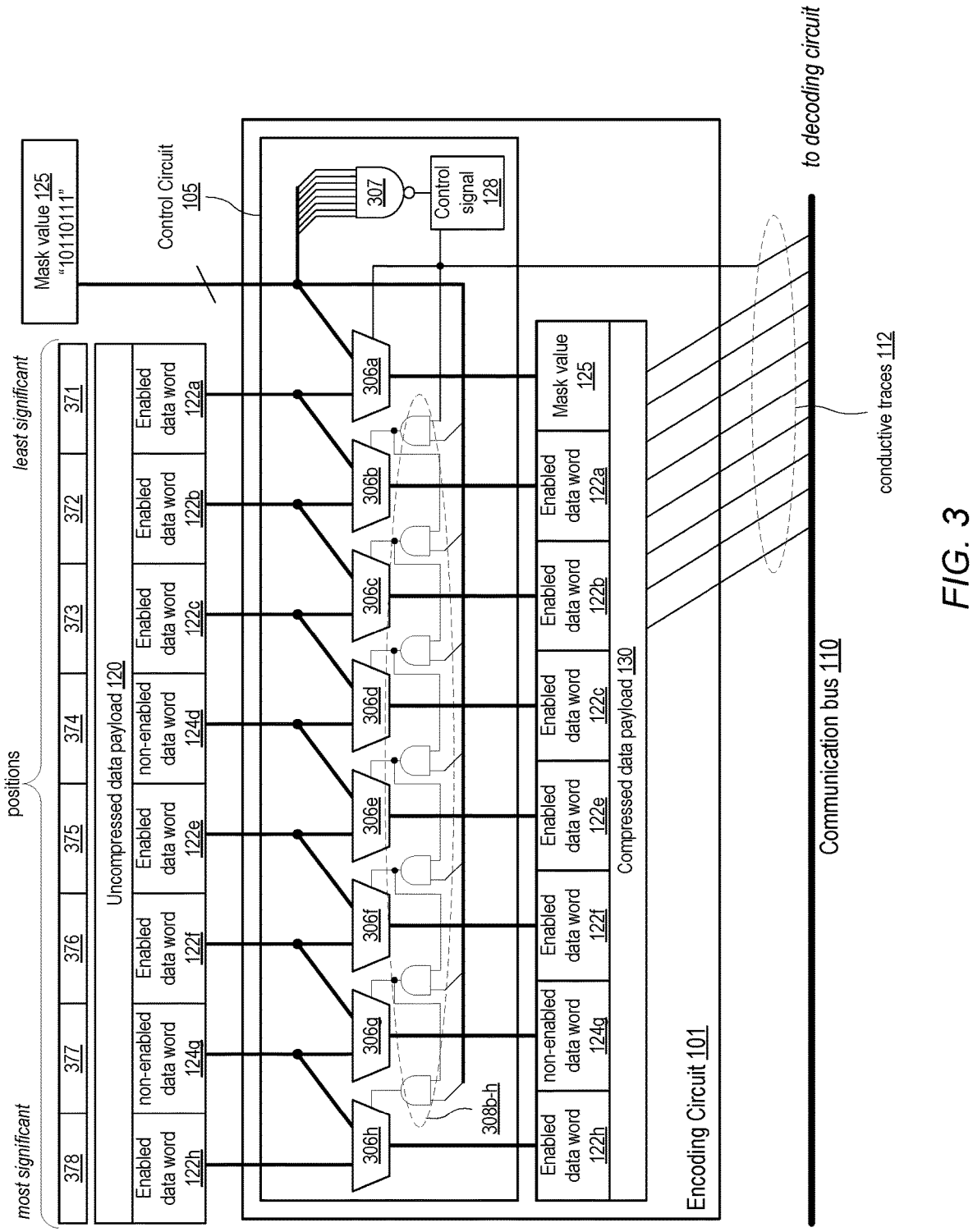
FIG. 3 depicts a block diagram of another embodiment of a computing device that includes an encoding circuit.
Figure 4:
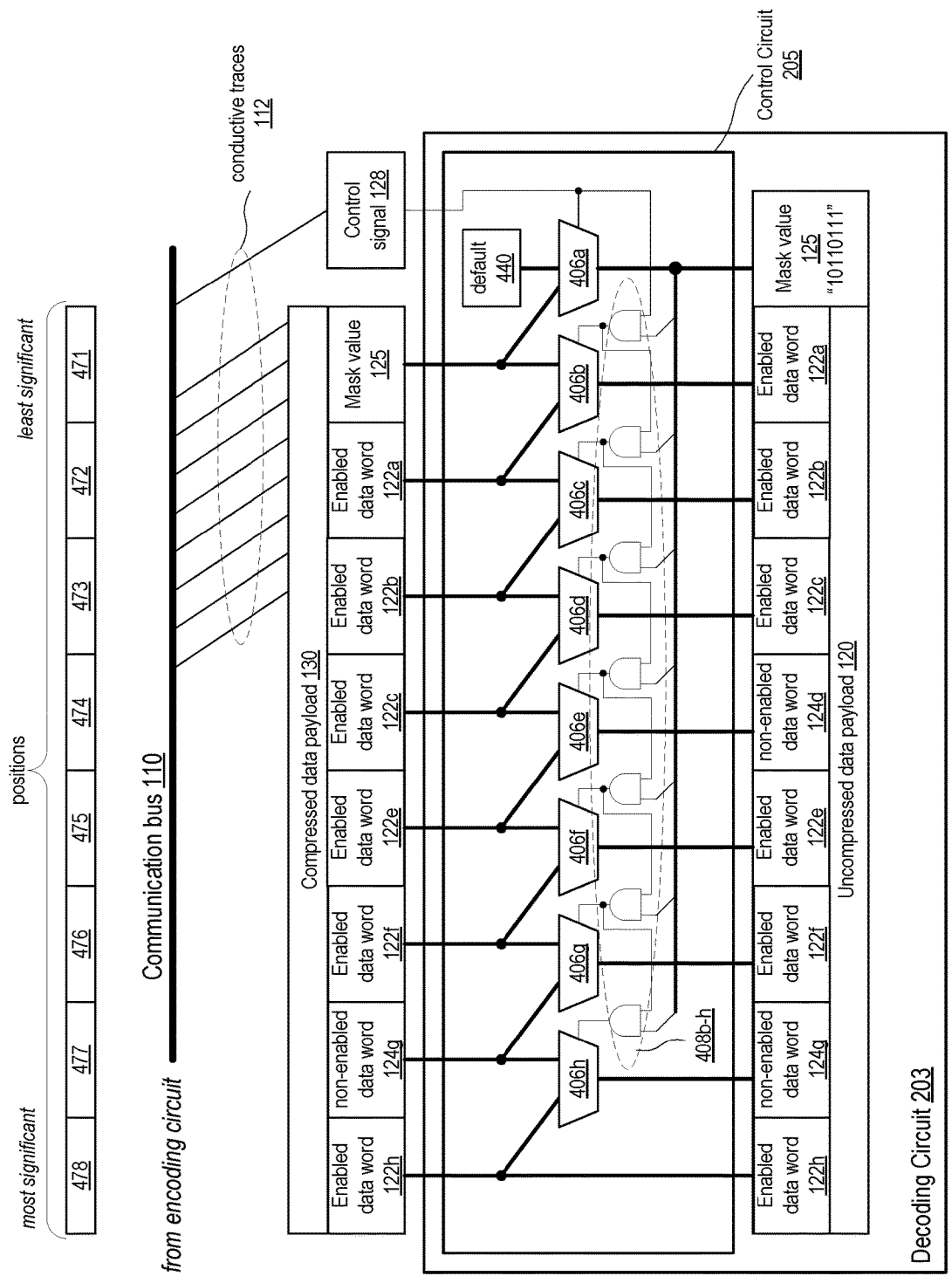
FIG. 4 illustrates a block diagram of another embodiment of a computing device that includes a decoding circuit.

FIGS. 1 and 2 illustrate block diagrams of encoding and decoding circuits that may be used in one or more computing devices to transfer a plurality of data words in parallel. In the descriptions of these circuits, control circuits are described that perform the encoding and decoding operations. In FIGS. 3 and 4, more detailed versions of the respective control circuits are illustrated and described below.

Turning to FIG. 3, a block diagram of another embodiment of encoding circuit 101 is depicted. Encoding circuit 101, as disclosed above, receives uncompressed data payload 120 and mask value 125. Control circuit 105 uses mask value 125 to generate compressed data payload 130 from uncompressed data payload 120. Control circuit 105 includes a set of multiplexing circuits (MUXs) 306a-306h (MUXs 306 for short), NAND gate 307, and a set of AND gates 308b-308h.

As illustrated, each data word of uncompressed data payload 120 is placed into a respective position within uncompressed data payload 120. Data words in uncompressed data payload 120 and compressed data payload 130 are arranged from a least significant position 371 to a most significant position 378. It is noted that the terms most significant and least significant are used merely to indicate a position within the payload. In other embodiments, other terminology may be used. In some embodiments, a position of a data word within a data payload may indicate a particular characteristic of the data word. For example, least significant position 371 may correspond to a value for a particular register used by the functional circuits that are sending or receiving the data payloads. A graphics processor may receive image data with each data word, or a particular number of consecutive data words, corresponding to a particular pixel in the image. Accordingly, an order of enabled data words in uncompressed data payload 120 may be preserved in compressed data payload 130 to enable the data word positions to be restored when compressed data payload is decoded at a receiving functional circuit.

Enabled data word 122a, as shown, is in least significant position 371 in uncompressed data payload 120, while enabled data word 122h is shown in most significant position 378, with the remaining enabled and non-enabled data words arranged in order of increasing significance from position 372 to position 377. To create compressed data payload 130, encoding circuit 101 is configured to move a particular enabled data word (e.g., enabled data word 122a) from a particular position in uncompressed data payload 120 (least significant position 371) to a different position in compressed data payload 130 (second to least significant position 372). Encoding circuit 101 is further configured to shift other enabled data words (e.g., enabled data words 122b and 122c) from less significant positions (positions 372 and 373) to more significant positions (positions 373 and 374) until a non-enabled data word (non-enabled data word 124d) is reached. To compress uncompressed data payload 120, control circuit 105 begins with least significant position 371, where enabled data word 122a is located, and shift enabled data words into a next higher significant position. In FIG. 3, control circuit 105 shifts each of enabled data words 122a-122c to their respective next higher positions. Since position 374 in uncompressed data payload 120 holds non-enabled data word 124d, no additional shifting is performed. Enabled data word 122c is shifted into position 374 of compressed data payload 130 and non-enabled data word 124d is omitted. Encoding circuit 101 is further configured to place mask value 125 into least significant position 371.

To identify which data words of uncompressed data payload 120 are enabled and which are not, control circuit 105 uses mask value 125. In the illustrated embodiment, mask value 125 includes one bit for each data word position in uncompressed data payload 120. A value of "1" for a particular bit indicates that a data word in a corresponding position in uncompressed data payload 120 is enabled, and indicates that the data word in the corresponding position is disabled if the value of the particular bit is "0." In other embodiments this logic may be reversed. To enable the shifting of data words, control circuit 105 utilizes mask value 125 in two ways. First, control signal 128 is generated by using each bit of mask value 125 as an input to NAND gate 307. If all data words in uncompressed data payload 120 are enabled, then each corresponding bit in mask value 125 will be set to "1" resulting in the output of NAND gate 307 (control signal 128) being set to "0." Otherwise, if at least one data word in uncompressed data payload 120 is non-enabled, the corresponding bit of mask value 125 is "0" and NAND gate 307 sets control signal 128 to "1." Control signal 128 is used as one input to each of AND gates 308b-308h.

The second way in which control circuit 105 utilizes mask value 125 is by using each bit of mask value 125 as a second input to a respective one of AND gates 308b-308h, with the exception of the bit that corresponds to the most significant position. As illustrated, an output of each AND gate 308b-308h is used as a control signal by a respective one of MUXs 306b-306h. No AND gate is used for the control signal of MUX 306a, just control signal 128. Control signal 128 provides an indication whether all data words of uncompressed data payload 120 are enabled or not. If all data words are enabled (control signal 128 is "0"), then mask value 125 is not sent to a decoding circuit receiving the data payload and, therefore, no compression of uncompressed data payload 120 is performed. The "0" value of control signal 128 is an input to MUX 306a, resulting in MUX 306a selecting enabled data word 122a as an input over mask value 125, and transferring the value of enabled data word 122a into least significant position 371 of compressed data payload 130. The "0" value of control signal 128 further causes AND gate 308b to set an output to "0," causing MUXs 306b to select a non-shifted input over a shifted input. For example, MUX 306b receives enabled data word 122b as a non-shifted input and enabled data word 122a as a shifted input, and selects enabled data word 122b when the output of AND gate 308b is "0."

The output of AND gate 308b is also used as an input to AND gate 308c. The output of AND gate 308c is an input to AND gate 308d, and so forth up to the final AND gate 308h. This chaining of the outputs of the first AND gate 308b through to the final AND gate 308h results in a first occurrence of an output of "0" causing all subsequent AND gates to have outputs of "0." In the all-data-words-enabled example above, the "0" output of AND gate 308b results in all AND gates 308c-308h having output values of "0."

As depicted in FIG. 3, mask value 125 is "10110111" indicating that two data words are not enabled. Accordingly, control signal 128 is set to "1" to indicate that at least one data word is not enabled. Based on the "1" value of control signal 128, MUX 306a selects mask value 125 as an input and transfers the value of mask value 125 into least significant position 371 of compressed data payload 130. The "1" value of control signal 128 further causes the output of AND gate 308b to be determined by a respective bit of mask value 125. If the data word in least significant position 371 is enabled, then MUX 306b selects the shifted data word as an input, and otherwise selects the unshifted data word. As shown, bit 0 of mask value 125 corresponds to least significant position 371 and is used as the second input to AND gate 308b to provide the selection signal for MUX 306b. The "1" value of bit 0 of mask value 125, in combination with the "1" value of control signal 128, causes a value of "1" to be set at the output of AND gate 308b, thereby causing MUX 306b to select the shifted data word (enabled data word 122a) as an input. Enabled data word 122a is placed into position 372 of compressed data payload 130. The logic gates in control circuit 105 further use the next two bits of mask value 125 (bits 1 and 2) to cause MUXs 306c and 306d to select the shifted data words (enabled data words 122b and 122c) and transfer these data words into the next two positions (373 and 374) of compressed data payload 130.

AND gate 308e receives the output of AND gate 308d ("1") and bit 3 of mask value 125, which is "0" to indicate that position 374 of uncompressed data payload 120 holds non-enabled data word 124d. This bit 3 value of "0" causes the output of AND gate 308e to be set to "0," thereby causing MUX 306e to select the non-shifted data word, enabled data word 122e, rather than the shifted data word, non-enabled data word 124d. The "0" value of AND gate 308e, along with bit 4 of mask value 125, is used as an input to AND gate 308f. The "0" received from AND gate 308e causes AND gate 308f, as well as the remaining AND gates 308g and 308h, to set their outputs to "0." Accordingly, MUXs 306e-306h all select the non-shifted data words to transfer to compressed data payload 130.

After compressed data payload 130 has been generated, encoding circuit 101 is configured to send compressed data payload 130 to the decoding circuit via the conductive traces of communication bus 110. Encoding circuit 101 is further configured to send control signal 128 over a single conductive trace of conductive traces 112 by asserting control signal 128 when at least one data word is non-enabled, and otherwise de-asserting control signal 128.

It is noted that the example of FIG. 3 merely demonstrates disclosed concepts. In other embodiments, a different combination of circuits may be included. For example, in other embodiments, the mask value and/or the control value may utilized different values to represent enabled and non-enabled data words. Accordingly, such embodiments may utilize different logic gates to provide selection signals to the multiplexing circuits and/or to generate the control signal. In some embodiments, a different type of switching circuit than a multiplexing circuit may be used to select between shifted and non-shifted data words.

FIG. 3 illustrates an example implementation of a control circuit for use in an encoding circuit. A similar implementation may be utilized for a control circuit used in a decoding circuit. FIG. 4 depicts such an embodiment of a decoding circuit.

Proceeding to FIG. 4, a block diagram of another embodiment of decoding circuit 203 is depicted. Decoding circuit 203, as disclosed above, receives compressed data payload 130 and control signal 128. Control circuit 205 uses control signal 128 to extract mask value 125, and to generate uncompressed data payload 120 from compressed data payload 130 and the extracted mask value. Control circuit 205 includes a set of multiplexing circuits (MUXs) 406a-406h (MUXs 406 for short), and a set of AND gates 408b-408h.

As illustrated, each data word of compressed data payload 130 is placed into a particular order from least significant position 471 to most significant position 478 within compressed data payload 130. As disclosed above, a position of a data word within a data payload may indicate a particular characteristic of the data word. Accordingly, an order of enabled data words in compressed data payload 130 may be preserved when generating uncompressed data payload 120 to restore the data word positions.

As described above, control signal 128 indicate whether compressed data payload 130 includes shifted data words and, if so, a corresponding mask value that provides indications of which data words are shifted. As illustrated, if any data words in compressed data payload 130 have been shifted, then control signal 128 is "1," otherwise, if no data word in compressed data payload 130 is shifted, control signal 128 is "0." If control signal 128 is "0," control circuit 205 of decoding circuit 203 performs no shifting of data words in compressed data payload 130. In addition, no mask value 125 is included in compressed data payload 130, and control circuit 205 uses default value 440 as a mask value. Default value 440 corresponds to a value of mask value 125 that is indicative of all data words of a received data payload being enabled. For example, as stated above, mask value 125 includes one bit for each data word in uncompressed data payload 120. A value of "0" indicates a non-enabled data word while a value of "1" indicates an enabled data word. Accordingly, for such an embodiment, default value 440 is all ones (e.g., "1111111").

In a similar manner as described for control circuit 105, control circuit 205 uses control signal 128 and an extracted mask value 125 or default value 440 to control AND gates 408b-408h and MUXs 406a-406h to place data words from a received compressed data payload 130 into uncompressed data payload 120. For a case in which control signal 128 is "0," MUX 406a uses control signal 128 to select default value 440 as mask value 125. AND gates 408b-408h are chained in series as described above for AND gates 308b-308h. Accordingly, a first instance of a "0" output of an AND gate 308b-308h results in all subsequent AND gates also generating outputs of "0." Control signal 128 is one input to AND gate 408b (coupled to a selection input of MUX 406b). In the case of control signal being "0," this "0" value causes AND gate 408b to set its output to "0" regardless of a value of mask value 125. The "0" output of AND gate 408b propagates through the remaining AND gates 408c-408h, causes all AND gates 408b-408h to generate output values of "0." Accordingly, all MUXs 406b-406h select their respective unshifted values from compressed data payload 130. For example, MUX 406b selects least significant position 471 as an unshifted data word and position 472 as a shifted data word. In the illustrated example, compressed data payload includes shifted data words, so least significant position 471 holds mask value 125 and position 472 holds enabled data word 122a. If compressed data payload 130 did not include shifted data words, then mask value 125 would not be included and enabled data words 122a-122c would be shifted one position to the right (e.g., positions 471-473).

In a case in which control signal 128 is "1," MUX 406a uses control signal 128 to retrieve mask value 125 from least significant position 471 of compressed data payload 130. As shown, mask value 125 is "10110111." Bit 0 from mask value 125 and control signal 128 are used as two inputs to AND gate 408b. Both of these inputs are "1" resulting in an output of "1." This "1" output of AND gate 408b causes MUX 406b to select the shifted data word, in this case enabled data word 122a, and transfer enabled data word 122a to least significant position 471 of uncompressed data payload 120. Based on the values of bits 1 and 2 of mask value 125 and control signal 128, MUXs 406c and 406d also select the shifted data word, resulting in enabled data words 122b and 122c being selected and transferred into the next two less significant positions (472 and 473) in uncompressed data payload 120. Bit 4 of mask value 125 is "0," which causes AND gate 408e to select the unshifted data word from compressed data payload 130. This value is shown in FIG. 4 as non-enabled data word 124d. In the current example, however, non-enabled data word 124d will have the same value as enabled data word 122c. Since this data word position is indicated as not enabled by mask value 125, a functional circuit that receives uncompressed data payload 120 may ignore the data word in position 474, making the value irrelevant.

The output of "0" from AND gate 408e propagates to AND gates 408f-408h, thereby causing MUXs 406f-406h to select the non-shifted data words and transfer these selected data words into the data words of uncompressed data payload 120 with a same significance. It is noted that the data word in most significant position 478 of uncompressed data payload 120 will, as illustrated, always be the data word from most significant position 478 of compressed data payload 130. If a data word in most significant position 478 of a given data payload is enabled, it will always remain in most significant position 478 of compressed data payload 130, regardless of a state of the other data words. In contrast, if a data word in most significant position 478 of the given data payload is not enabled and the data word at position 477 is shifted into most significant position 478 of compressed data payload 130, then during the decoding operation, most significant position 478 of uncompressed data payload 120 will have a non-enabled data word with a value equal to the data word in position 477 of uncompressed data payload 120.

After the decoding operation has completed, and all positions 471-478 of uncompressed data payload 120 have been set, decoding circuit 203 may send an indication to an associated functional circuit that a data payload is ready to be retrieved. In other embodiments, decoding circuit 203 may send uncompressed data payload 120 and mask value 125 to the associate function circuit.

It is noted that FIG. 4 depicts one example of a decoding circuit. Different circuit combinations may be utilized in other embodiments. For example, other embodiments may utilize different logic circuits to perform the described operations. In some embodiments, the significance and/or shifting of the data words may be reversed or otherwise modified from those described.

Figure 5:
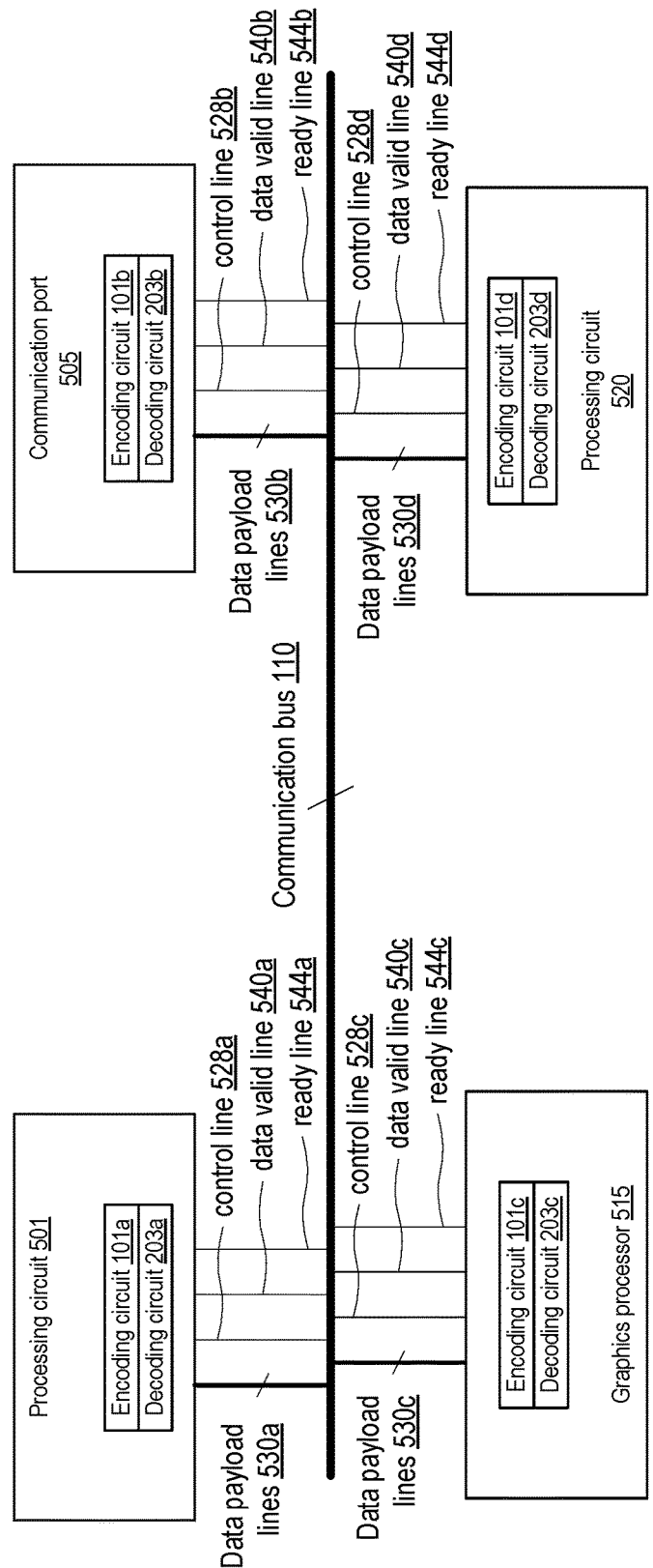
FIG. 5 shows a block diagram of an embodiment of a computing device that includes several functional circuits coupled to a communication bus.

FIGS. 1-4 have focused on various aspects of encoding and decoding circuits used for transferring data payloads. Functional circuits have been described as sending data payloads to an encoding circuit and receiving data payloads from a decoding circuit. FIG. 5 illustrates a system that includes a plurality of functional circuits that send and receive data payloads using encoding and decoding circuits.

Moving now to FIG. 5, an embodiment of a computing device is depicted that includes a variety of functional circuits that communicate via a communication bus. Computing device 500 includes four functional circuits: processing circuit 501, communications port 505, graphics processor 515 and processing circuit 520. The four functional circuits may communicate to one another via communication bus 110. To support use of communication bus 110, each of the four functional circuits includes a respective implementation of encoding circuit 101 and decoding circuit 203. In various embodiments, processing circuit 501, communications port 505, graphics processor 515 and processing circuit 520 may be implemented on a single IC, such as an SoC, or each functional circuit may be implemented on a separate IC, or a combination thereof. Accordingly, communication bus 110 may include conductive traces that are implemented as any suitable combination of metallic lines in an IC, metallic traces on a circuit board, and conductive wires in a cable coupled between circuit boards.

Processing circuit 501, in various embodiments, may include one or more processing cores, such as general-purpose processing cores configured to implement any suitable instruction set architecture (ISA). In some embodiments, processing circuit may include a custom processing core, such as an application specific IC (ASIC) or programmable logic array (PLA). Communication port 505 may include circuits configured to implement any suitable communication protocol for exchanging information with another computing device and/or one or more computing peripherals. For example, communications port 505 may support universal serial bus (USB), Ethernet, and/or peripheral component interconnect (PCI). Graphics processor 515 includes one or more processing cores configured to process image and video information, for example, to display on a screen. Processing circuit 520 may correspond to any other suitable type of data processing circuit configured to receive, modify, and/or send information in a computing system. For example, processing circuit 520 may be an audio processor, a digital signal processor, an encryption/security processor, and the like. Processing circuit 501, communications port 505, graphics processor 515 and processing circuit 520 are merely four examples of functional circuits that may utilize embodiments of the encoding and decoding circuits described herein.

Processing circuit 501, communications port 505, graphics processor 515 and processing circuit 520 are configured to send and receive information via communication bus 110 using a plurality of data payloads transferred to and from communication bus 110. Each of these functional circuits utilize a respective one of encoding circuits 101a-101d to encode a particular data payload being sent, and a respective one of decoding circuits 203a-203d to decode a given received data payload. Encoding circuits 101a-101d and decoding circuits 203a-203d depict implementations of the encoding and decoding circuits described above in regards to FIGS. 1-4.

As an example of a data payload transfer, graphics processor 515 may send one or more data payloads to communication port 505, e.g., to store a video file onto a USB connected storage drive or to display on an Ethernet connected screen. Graphics processor 515 generates a series of data payloads that comprise the video file, as well as data payloads that contain, for example, metadata associated with the video file or instructions for the storage device or display screen. Accordingly, some of the data payloads have all data words enabled while some data payloads have one or more data words that are not enabled.

To send a particular data payload, graphics processor 515, as shown, sends the particular data payload, along with an associated mask value, to encoding circuit 101c. Encoding circuit 101c, using a technique described above, uses the mask value to generate a control signal and to compress the particular data payload. In response to ready line 544c indicating that communication bus 110 is available, encoding circuit 101c sends the compressed data payload and the control signal to communication bus 110 using data payload lines 530c and control line 528c, respectively. Encoding circuit 101c asserts data valid line 540c to indicate when data payload lines 530c and control line 528c are ready to be accessed.

Communication port 505 receives the compressed data payload from graphics processor 515 using decoding circuit 203b. In response to data valid line 540b indicating that communication bus 110 is ready to be accessed, decoding circuit 203b receives the compressed data payload from data payload lines 530b and receives, in parallel, the control signal from control line 528b. Decoding circuit 203b, using a techniques disclosed above, uses the control signal to determine whether compressed data payload includes shifted data. If the compressed data payload includes shifted data, decoding circuit 203b decodes the compressed data payload using a mask value extracted from the compressed data payload to identify shifted data words. Otherwise, if the control signal indicates that no data words are shifted, decoding circuit 203b decodes the compressed data payload using a default mask value. Decoding circuit 203b generates an uncompressed data payload from the compressed data payload and makes the uncompressed data payload available to appropriate circuits in communication port 505 to send to a storage device via USB or to a display screen using Ethernet.

Use of the disclosed techniques in the example of FIG. 5 allows a reduction in a number of conductive traces included in communication bus 110. Rather than supporting an uncompressed data payload in addition to a number of traces for the mask value, the multiple bits of the mask value may be reduced to a single control signal. The additional traces for data valid and ready signals may be needed regardless of a number of traces used for the data payload and control signal.

It is noted that the computing device depicted in FIG. 5 is an example. The block diagram of computing device 500 has been simplified for clarity. In other embodiments, additional circuit blocks may be included, such as memory blocks, power management circuits, clock generation circuits, and the like. Although each of the functional circuits are shown as having a single implementation of an encoding circuit and a decoding circuit, in other embodiments, each functional circuit may include multiple implementations of both encoding and decoding circuits to increase a number of data payloads that sent and received in parallel.

The circuits described above in FIGS. 1 and 3 may perform encoding operations using a variety of methods. Two methods for compressing a data payload by an encoding circuit are described in FIGS. 6 and 7.

Figure 6:
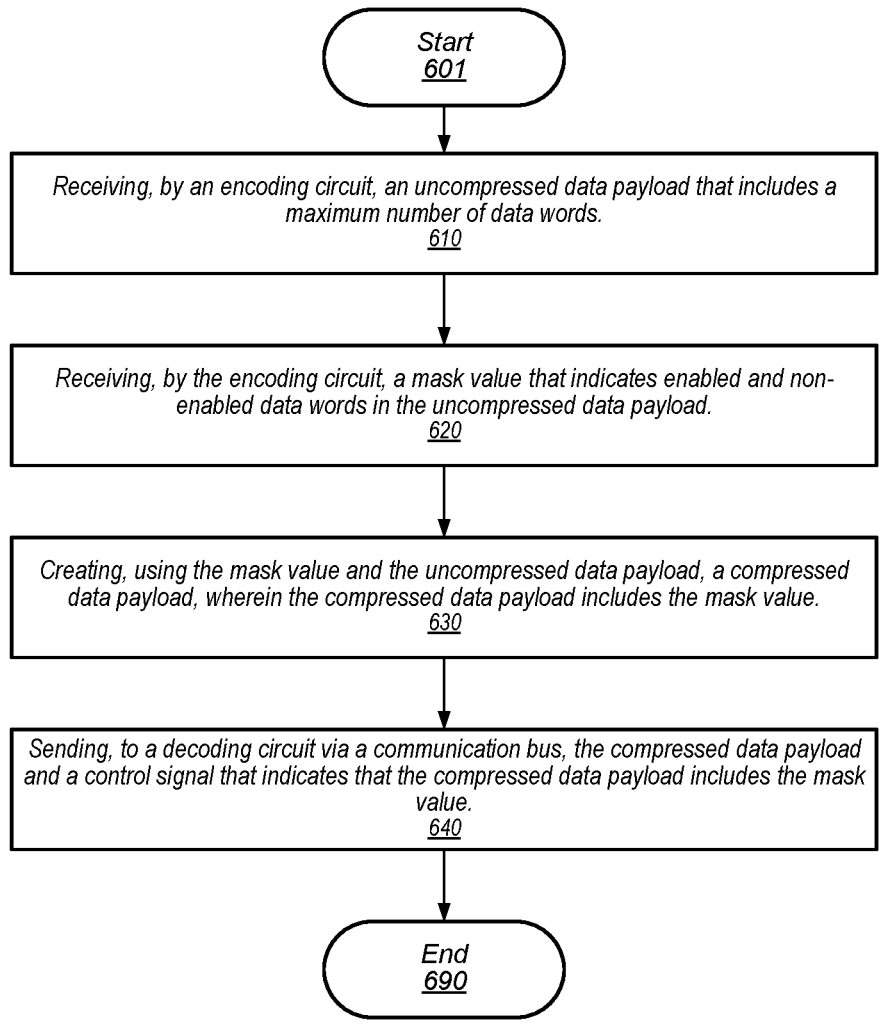
FIG. 6 depicts a flow diagram for an embodiment of a method for compressing a data payload that includes at least one non-enabled data word.

Turning now to FIG. 6, a flow diagram for an embodiment of a method for compressing, by an encoding circuit, a data payload with a non-enabled data word is shown. Method 600 may be performed by an encoding circuit, for example, encoding circuit 101 in FIGS. 1 and 3. In some embodiments, method 600 may be performed by a computer system (e.g., computing device 100) that has access to a non-transitory, computer-readable medium having program instructions stored thereon that are executable by the computer system to cause the operations described in regards to FIG. 6. Referring collectively to FIGS. 3 and 6, method 600 begins in block 601.

At block 610, method 600 includes receiving, by encoding circuit 101, uncompressed data payload 120 that includes a maximum number of data words. Uncompressed data payload 120 is received from a functional circuit, for example, any of processing circuit 501, communications port 505, graphics processor 515 and processing circuit 520 as shown in FIG. 5. Data included in uncompressed data payload 120 may include any suitable information, such as a portion of a file being transferred, commands being sent to a different function circuit, and the like. The maximum number of data words is determined by a maximum number of data words that can be transferred in parallel via communication bus 110. Accordingly, the maximum number of data words is dependent on a number of conductive trances coupled between encoding circuit 101 and communication bus 110.

Method 600 further includes, at block 620, receiving, by encoding circuit 101, mask value 125 that indicates enabled and non-enabled data words in uncompressed data payload 120. Various payloads being transferred via encoding circuit 101 may have any number of enabled data words, from a single data word to the maximum number. As shown, uncompressed data payload 120 includes enabled data words 122*a*-122*c*, 122*e*, 122*f*, and 122*h*, as well as non-enabled data words 124*d* and 124*g*. Non-enabled data words 124*d* and 124*g* may be used to maintain a particular arrangement of the enabled data words within uncompressed data payload 120. Since each the data words within uncompressed data payload 120 do not include an indication if they are enabled or not, mask value 125 is received in parallel with uncompressed data payload 120 to identify which positions in uncompressed data payload 120 are enabled. In FIG. 3, mask value 125 is shown with a value of "10110111." In the illustrated embodiment, a bit value of "1" indicates that a corresponding position in uncompressed data payload 120 holds an enabled data word, while a bit value of "0" indicates the data word in the corresponding position is not enabled. The six "1" values in "10110111" correspond to enabled data words 122*a*-122*c*, 122*e*, 122*f*, and 122*h*, while the two "0" values correspond to non-enabled data words 124*d* and 124*g*.

At block 630, method 600 further includes creating, using mask value 125 and uncompressed data payload 120, compressed data payload 130, wherein compressed data payload 130 includes mask value 125. To make room in compressed data payload 130 for mask value 125, one of non-enabled data words 124*d* and 124*g* are removed. As shown, control circuit 105 uses mask value 125 to determine that the three least significant positions (371-373) of uncompressed data payload 120 hold enabled data words 122*a*-122*c*. These three data words are left shifted into positions 372-374 of compressed data payload 130, e.g., into positions that are of one higher significance than their positions in uncompressed data payload 120. Using mask value 125, control circuit 105 determines that the next higher position (374) in uncompressed data payload 120 (non-enabled data word 124*d*) is not enabled. In response, the data in this data word is not transferred into compressed data payload 130. The remaining four data words (enabled data words 122*e*, 122*f*, 122*h* and non-enabled data word 124*g*) are transferred into compressed data payload without shifting. Control circuit 105 transfers mask value 125 into least significant position 371 of compressed data payload 130 that is made available by the shifting.

Method 600 also includes, at block 640, sending, to a decoding circuit via communication bus 110, compressed data payload 130 and control signal 128 that indicates that compressed data payload 130 includes mask value 125, wherein communication bus 110 has a number of conductive traces 112, the number corresponding to the maximum number of data words. Encoding circuit 101 transfers compressed data payload 130 to a different functional circuit using communication bus 110. In some embodiments, encoding circuit 101 may transfer compressed data payload 130 in response to a signal, such as a ready signal, indicating that communication bus 110 is available. Compressed data payload 130 and control signal 128 are transferred to communication bus 110 via conductive traces 112. The method ends in block 690.

Figure 7:
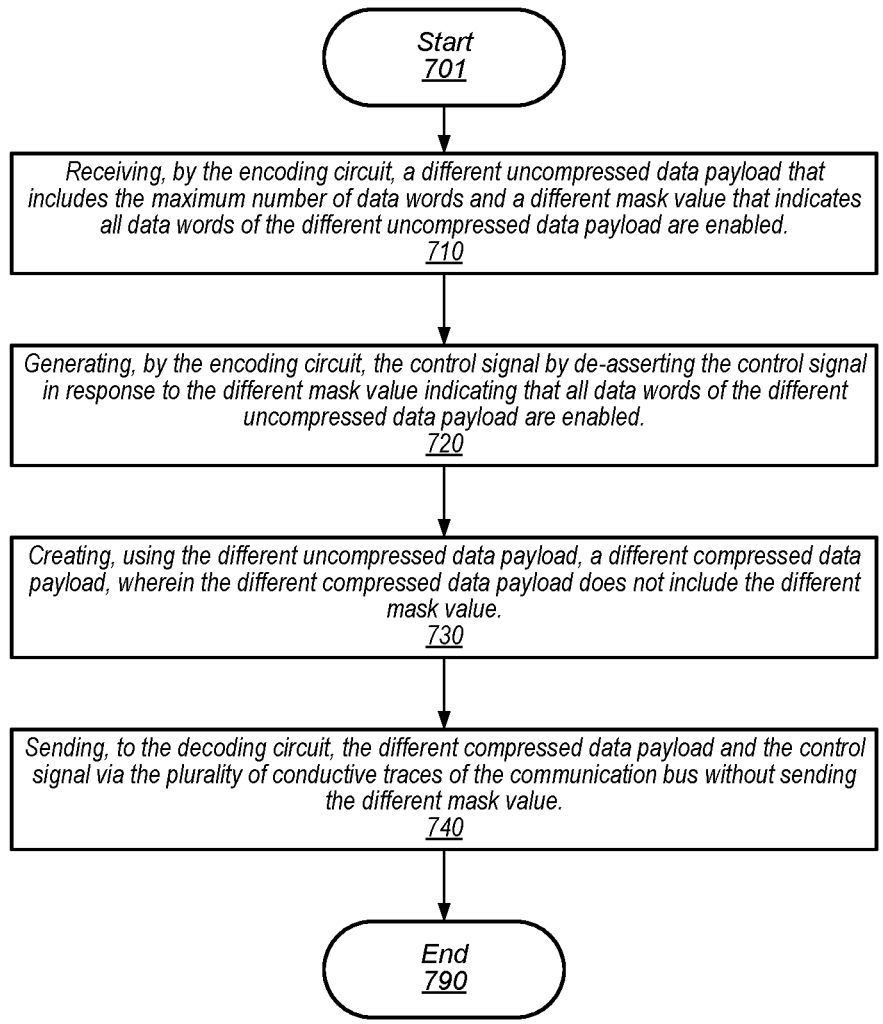
FIG. 7 shows a flow diagram for an embodiment of a method for compressing a data payload in which all data words are enabled.

Proceeding now to FIG. 7, a flow diagram of a method for an embodiment of a method for compressing, by an encoding circuit, a data payload with all data words enabled is shown. In a similar manner as method 600, method 700 may be performed by an encoding circuit such as encoding circuit 101 in FIGS. 1 and 3. Method 700, in some embodiments, may be performed by a computer system (e.g., computing device 100) that has access to a non-transitory, computer-readable medium having program instructions stored thereon that are executable by the computer system to cause the operations described in regards to FIG. 7. Referring collectively to FIGS. 3 and 7, the method begins in block 701.

At block 710, method 700 includes receiving, by encoding circuit 101, a different uncompressed data payload that includes the maximum number of data words and a different mask value that indicates all data words of the different uncompressed data payload are enabled. Encoding circuit 101 receives an uncompressed data payload in which all positions hold enabled data words. The different mask value for such a data payload is "11111111."

Method 700 further includes, at block 720, generating, by encoding circuit 101, control signal 128 by de-asserting control signal 128 in response to the different mask value indicating that all data words of the different uncompressed data payload are enabled. The individual bits of the different mask value are used as inputs to NAND gate 307. The value of "11111111" results in NAND gate 307 generating a value of "0" for control signal 128. As described herein, a "de-asserted" signal refers to a signal with a logic value of "0" and an "asserted" signal refers to a signal with a logic value of "1." It is noted, however, that in other embodiments, a signal may have an "active low" logic such that a logic value of "0" corresponds to an asserted signal and a logic value of "1" corresponds to a de-asserted signal.

At block 730, method 700 further includes creating, using the different uncompressed data payload, a different compressed data payload, wherein the different compressed data payload does not include the different mask value. Since all data words of the different uncompressed data payload are enabled, control circuit 105 transfers all data words of the different uncompressed data payload to the different compressed data payload without shifting any data words. Since all data words are enabled, the different mask value is excluded from the different compressed data payload.

Method 700 also includes, at block 740, sending, to the decoding circuit, the different compressed data payload and control signal 128 via the plurality of conductive traces 112 of communication bus 110 without sending the different mask value. Encoding circuit 101 may transfer the different compressed data payload in response to a ready signal that indicates that communication bus 110 is available. Since the different compressed data payload excludes the different mask value, the different mask value is not sent to the decoding circuit. A mask value may be omitted from a compressed data payload when all data words are enabled since, in the described embodiments, a single mask value (e.g., "11111111") corresponds to the all data words enabled case. The decoding circuit, therefore, can use the single value as a default mask value when control signal 128 indicates the all-enabled case. The method ends in block 790

It is noted that methods 600 and 700 of FIGS. 6 and 7 are merely examples. Variations of the disclosed methods are contemplated. For example, blocks 610 and 620 of method 600 are shown as being performed serially. In various embodiments, the uncompressed data payload and the mask value are received in parallel.

The decoding circuits described above in FIGS. 2 and 4 may perform decoding operations using a variety of methods. Two methods for decompressing a data payload by a decoding circuit are described in FIGS. 8 and 9.

Figure 8:
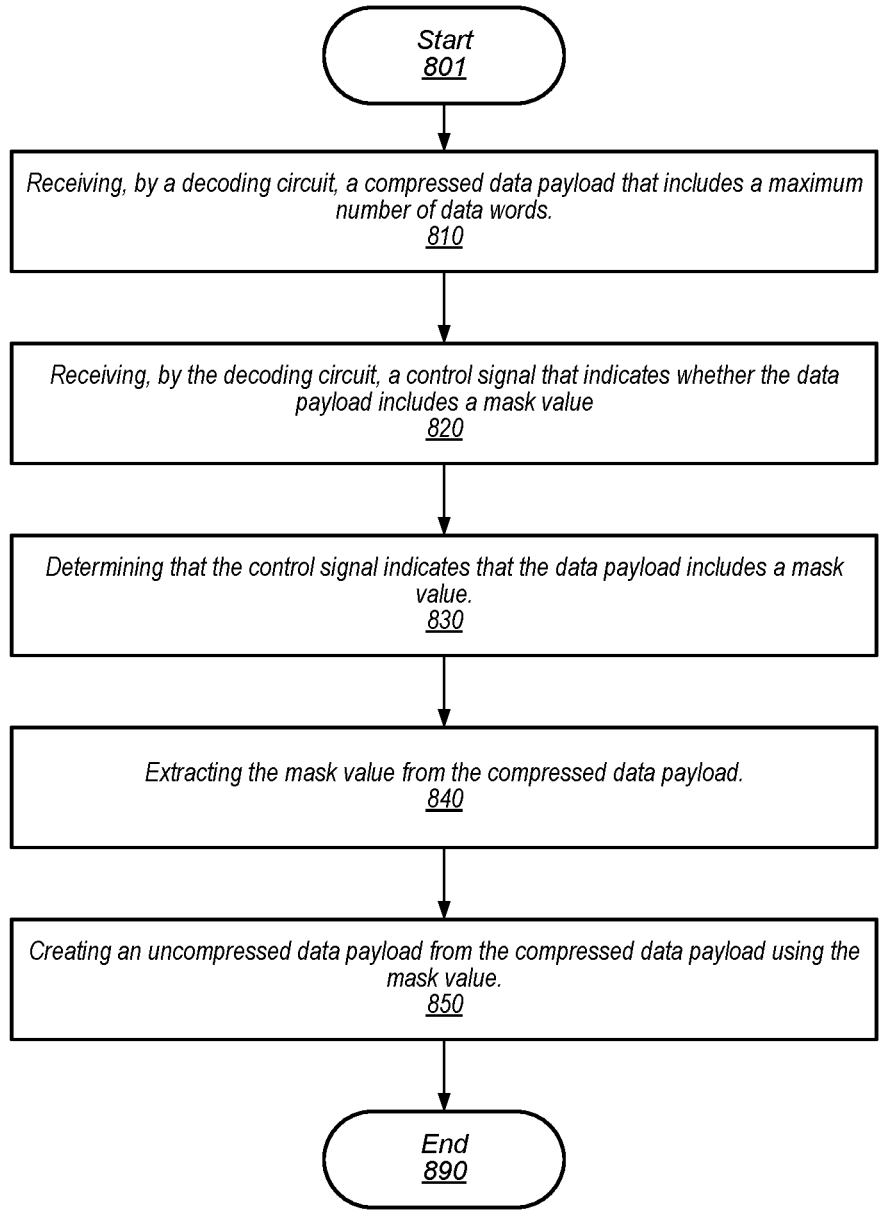
FIG. 8 illustrates a flow diagram for an embodiment of a method for decompressing a data payload that includes at least one non-enabled data word.

Moving to FIG. 8, a flow diagram for an embodiment of a method for decompressing, by a decoding circuit, a received data payload that includes a mask value is shown. Method 800 may be performed by a decoding circuit, for example, decoding circuit 203 in FIGS. 2 and 4. In some embodiments, method 800 may be performed by a computer system (e.g., computing device 200) that has access to a non-transitory, computer-readable medium having program instructions stored thereon that are executable by the computer system to cause the operations described in regards to FIG. 8. Referring collectively to FIGS. 4 and 8, method 800 begins in block 801.

Method 800 includes, at block 810, receiving, by decoding circuit 203, compressed data payload 130 that includes a maximum number of data words. Compressed data payload 130 is received by decoding circuit 203 from communication bus 110 via conductive traces 112. Compressed data payload 130 may be sent by any suitable functional circuit, for example, any of processing circuit 501, communications port 505, graphics processor 515 and processing circuit 520 as shown in FIG. 5. Compressed data payload 130 includes information such as a portion of a file being transferred, commands for a function circuit associated with decoding circuit 203, or any other suitable data. As previously disclosed, the maximum number of data words is determined by a maximum number of data words that can be transferred in parallel via communication bus 110.

At block 820, the method includes receiving, by decoding circuit 203, control signal 128 that indicates whether compressed data payload 130 includes a mask value. The received control signal 128 has a value the indicates whether compressed data payload 130 includes a mask value to identify if particular data words included in compressed data payload 130 are enabled or disabled. As illustrated, control signal 128 is received via a single one of conductive traces 112 and includes a single bit value. In various embodiments, a logic "0" or logic "1" may indicate presence of a mask value while the opposite logic value indicates no mask value is included. In some embodiments, control signal may include additional bits to provide additional information about data included in compressed data payload 130, such as a type data, a number of enabled data words, a size of data words, and the like.

In addition, at block 830, method 800 includes determining that control signal 128 indicates that compressed data payload 130 includes mask value 125. Decoding circuit 203 determines that the received value of control signal 128 indicates that compressed data payload 130 includes mask value 125. Accordingly, decoding circuit 203 further determines that compressed data payload 130 includes at least one data word that is not enabled.

The method further includes, at block 840, extracting mask value 125 from compressed data payload 130. To determine which data words in compressed data payload 130 are enabled and which are not, control circuit 205 in decoding circuit 203 extracts mask value 125 from compressed data payload 130. As described above in regards to FIG. 4, mask value 125, when included in a compressed data payload, is located in the least significant position (e.g., 471) in the payload. An asserted value of control signal 128 causes control circuit 205 to use the data word in least significant position 471 as mask value 125. In the illustrated example, mask value 125 is "10110111."

At block 850, method 800 also includes creating uncompressed data payload 120 from compressed data payload 130 using mask value 125. To generate uncompressed data payload 120, control circuit 205 uses mask value 125 to control selection inputs on MUXs 406*b*-406*h*. Based on mask value 125, enabled data words 122*a*-122*c* are shifted from their positions 472-474 in compressed data payload 130 to less significant positions 471-473 in uncompressed data payload 120. This shifting opens position 474 for non-enabled data word 124*d* that was not included in compressed data payload 130. The value used for non-enabled data word 124*d* is, as shown in FIG. 4, the same as the value for enabled data word 122*c*. The data words in positions 475-478 in compressed data payload 130 hold enabled data words 122*e*, 122*f*, 122*h*, and non-enabled data word 124*g*. These data words in positions 475-478 are transferred to the same positions 475-478 of uncompressed data payload 120 without shifting. It is noted that the data value for non-enabled data word 124*g* is preserved from compressed data payload 130. In some embodiments, a default value may be used in uncompressed data payload 120 for the non-enabled data words in place of data values transferred from compressed data payload 130. For example, rather than copying data values from compressed data payload 130, control circuit 205 may retain a data value for non-enable data words 124*d* and 124*g* from a prior uncompressed data payload, thereby reducing an amount of circuit switching in the storage elements that hold uncompressed data payload 120 in decoding circuit 203. The method ends in block 890.

Figure 9:
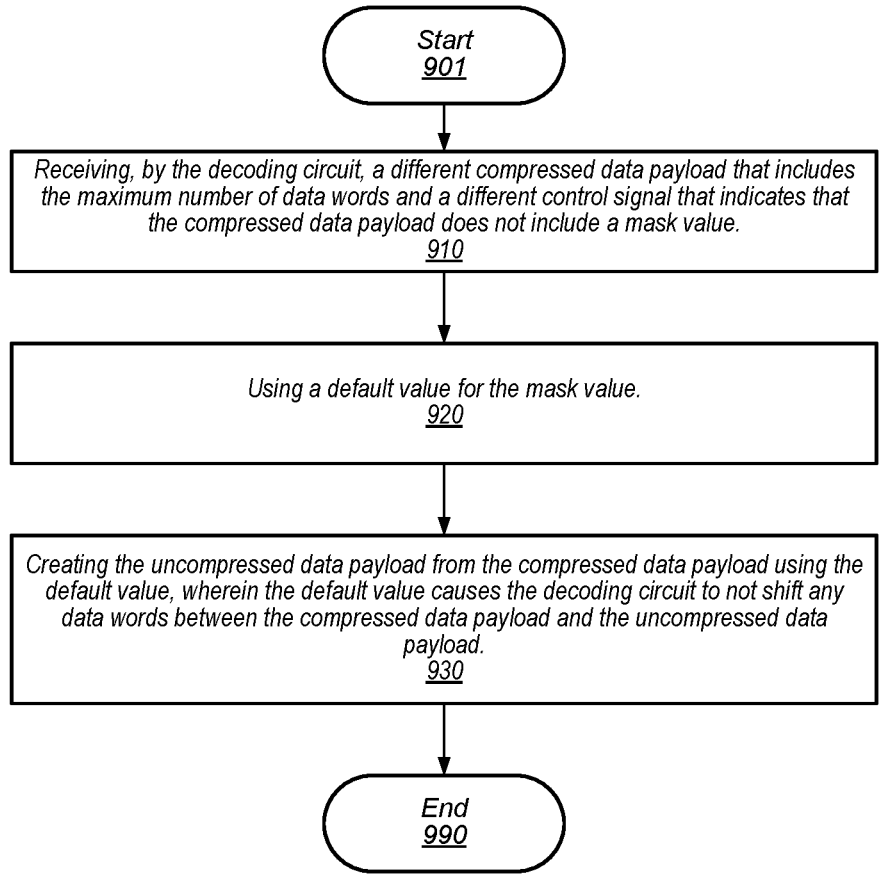
FIG. 9 depicts a flow diagram for an embodiment of a method for decompressing a data payload in which all data words are enabled.

Turning to FIG. 9, a flow diagram of a method for an embodiment of a method for decompressing, by a decoding circuit, a compressed data payload with all data words enabled is shown. In a similar manner as method 800, method 900 may be performed by an decoding circuit such as decoding circuit 203 in FIGS. 2 and 4. Method 900, in some embodiments, may be performed by a computer system (e.g., computing device 200) that has access to a non-transitory, computer-readable medium having program instructions stored thereon that are executable by the computer system to cause the operations described in regards to FIG. 9. Referring collectively to FIGS. 4 and 9, the method begins in block 901.

At block 910, the method includes receiving, by decoding circuit 203, a different compressed data payload 130 that includes the maximum number of data words and a different control signal 128 that indicates that compressed data payload 130 does not include a mask value. In the disclosed embodiments, control signal 128 is de-asserted when compressed data payload 130 does not include a mask value. As described above, however, control signal may utilize other values to indicate that compressed data payload 130 does not include a mask value.

Method 900 further includes, at block 920, using default value 440 for mask value 125. As shown in FIG. 4, control circuit 205 uses control signal 128 to select between a data word in least significant position 471 in compressed data payload 130 and default value 440 for use as mask value 125. In response to the de-asserted value of control signal 128, default value 440 is selected as mask value 125. In the current embodiment, default value 440 is "11111111."

At block 930, method 900 also includes creating uncompressed data payload 120 from compressed data payload 130 using default value 440, wherein default value 440 causes decoding circuit 203 to not shift any data words between compressed data payload 130 and uncompressed data payload 120. As described above for method 800, control circuit 205 uses mask value 125 to control selection inputs to MUXs 406b-406h. Default value 440 ("11111111") in combination with control signal 128 causes all of MUXs 406b-406h to select the non-shifted inputs, resulting in the data words in compressed data payload 130 to be placed into the same positions 471-478 in uncompressed data payload 120. After uncompressed data payload 120 has been updated with the data words from compressed data payload 130, decoding circuit 203 may indicate to an associated functional circuit, e.g., one of the functional circuits disclosed in FIG. 5, that uncompressed data payload 120 is ready to be retrieved. In other embodiments, decoding circuit 203 may store uncompressed data payload 120 in storage circuits for later access by the functional circuit. The method ends in block 990.

It is noted that methods 800 and 900 of FIGS. 8 and 9 are examples for demonstrating disclosed concepts. In other embodiments, operations may be performed in a different order, and some operations may be performed in parallel. Although, blocks 810 and 820 of method 800 are shown as being performed serially, in some embodiments, the compressed data payload and the control signal are received in parallel.

Figure 10:
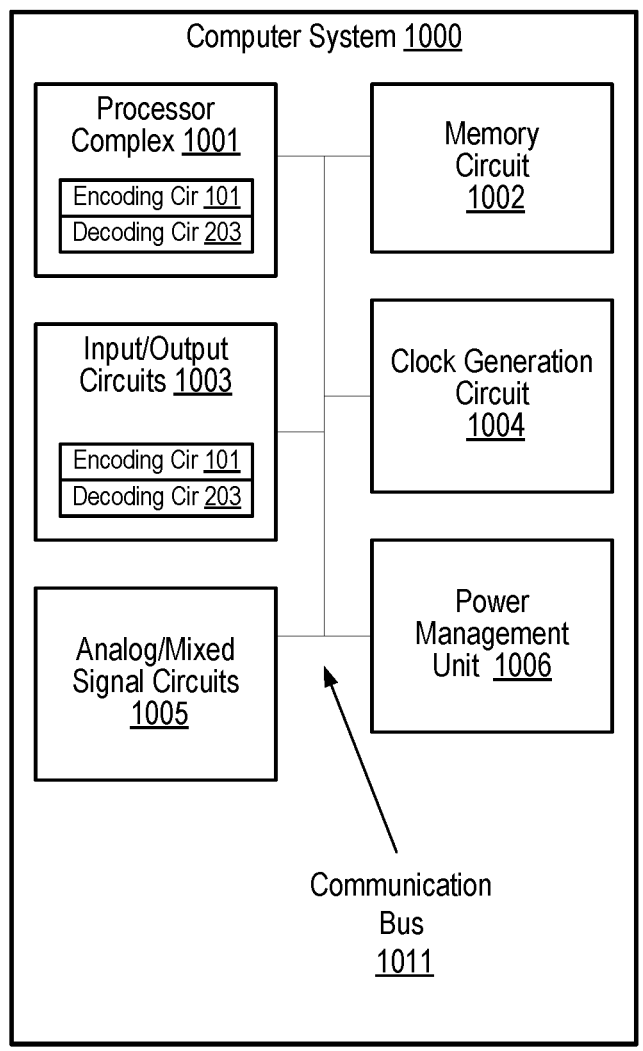
FIG. 10 shows a block diagram of an embodiment of a computing device that includes a system.

FIGS. 1-9 illustrate apparatus and methods for encoding and decoding circuits in a computing device. Encoding and decoding circuits, such as those described above, may be used in a variety of computer systems, such as a desktop computer, laptop computer, smartphone, tablet, wearable device, and the like. In some embodiments, the circuits described above may be implemented on a system-on-chip (SoC) or other type of integrated circuit. A block diagram illustrating an embodiment of computer system 1000 that includes the disclosed circuits is illustrated in FIG. 10. Computer system 1000 may, in some embodiments, correspond to computing device 100, 200, and/or 500 in FIGS. 1-5. As shown, computer system 1000 includes processor complex 1001, memory circuit 1002, input/output circuits 1003, clock generation circuit 1004, analog/mixed-signal circuits 1005, and power management unit 1006. These functional circuits are coupled to each other by communication bus 1011. In some embodiments, communication bus 1011 corresponds to communication bus 110 in FIGS. 1-5. As shown, both processor complex 1001 and input/output circuits 1003 include respective embodiments of encoding circuit 101 and decoding circuit 203.

Processor complex 1001, in various embodiments, may be representative of a general-purpose processor that performs computational operations. For example, processor complex 1001 may be a central processing unit (CPU) such as a microprocessor, a microcontroller, an application-specific integrated circuit (ASIC), or a field-programmable gate array (FPGA). In some embodiments, processor complex 1001 may correspond to a special purpose processing core, such as a graphics processor, audio processor, or neural processor, while in other embodiments, processor complex 1001 may correspond to a general-purpose processor configured and/or programmed to perform one such function. Processor complex 1001, in some embodiments, may include a plurality of general and/or special purpose processor cores as well as supporting circuits for managing, e.g., power signals, clock signals, and memory requests. In addition, processor complex 1001 may include one or more levels of cache memory to fulfill memory requests issued by included processor cores. As shown, processor complex 1001 includes implementations of encoding circuit 101 and decoding circuit 203. In various embodiments, processor complex 1001 may include a single embodiment of each circuit or may include multiple embodiments for use by multiple cores. Processor complex 1001 may utilize encoding circuit 101 and decoding circuit 203 to send and receive, respectively, data payloads across communication bus 1011, or other bus structures that are not illustrated.

Memory circuit 1002, in the illustrated embodiment, includes one or more memory circuits for storing instructions and data to be utilized within computer system 1000 by processor complex 1001. In various embodiments, memory circuit 1002 may include any suitable type of memory such as a dynamic random-access memory (DRAM), a static random access memory (SRAM), a read-only memory (ROM), electrically erasable programmable read-only memory (EEPROM), or a non-volatile memory, for example. It is noted that in the embodiment of computer system 1000, a single memory circuit is depicted. In other embodiments, any suitable number of memory circuits may be employed. In some embodiments, memory circuit 1002 may include a memory controller circuit as well as communication circuits for accessing memory circuits external to computer system 1000.

Input/output circuits 1003 may be configured to coordinate data transfer between computer system 1000 and one or more peripheral devices. Such peripheral devices may include, without limitation, storage devices (e.g., magnetic or optical media-based storage devices including hard drives, tape drives, CD drives, DVD drives, etc.), audio processing subsystems, or any other suitable type of peripheral devices. In some embodiments, input/output circuits 1003 may be configured to implement a version of Universal Serial Bus (USB) protocol or IEEE 1394 (Firewire®) protocol.

Input/output circuits 1003 may also be configured to coordinate data transfer between computer system 1000 and one or more devices (e.g., other computing systems or integrated circuits) coupled to computer system 1000 via a network. In one embodiment, input/output circuits 1003 may be configured to perform the data processing necessary to implement an Ethernet (IEEE 802.3) networking standard such as Gigabit Ethernet or 10-Gigabit Ethernet, for example, although it is contemplated that any suitable networking standard may be implemented. As illustrated, input/output circuits 1003 include one or more instances of encoding circuit 101 and decoding circuit 203 to support transfer of data payloads to and from various communication interfaces.

Clock generation circuit 1004 may be configured to enable, configure and manage outputs of one or more clock sources. In various embodiments, the clock sources may be located in analog/mixed-signal circuits 1005, within clock generation circuit 1004, in other blocks with computer system 1000, or come from a source external to computer system 1000, coupled through one or more I/O pins. In some embodiments, clock generation circuit 1004 may be capable of enabling and disabling (e.g., gating) a selected clock source before it is distributed throughout computer system 1000. Clock generation circuit 1004 may include registers for selecting an output frequency of a phase-locked loop (PLL), delay-locked loop (DLL), frequency-locked loop (FLL), or other type of circuits capable of adjusting a frequency, duty cycle, or other properties of a clock or timing signal.

Analog/mixed-signal circuits 1005 may include a variety of circuits including, for example, a crystal oscillator, PLL or FLL, and a digital-to-analog converter (DAC) (all not shown) configured to generated signals used by computer system 1000. In some embodiments, analog/mixed-signal circuits 1005 may also include radio frequency (RF) circuits that may be configured for operation with cellular telephone networks. Analog/mixed-signal circuits 1005 may include one or more circuits capable of generating a reference voltage at a particular voltage level, such as a voltage regulator or band-gap voltage reference.

Power management unit 1006 may be configured to generate a regulated voltage level on a power supply signal for processor complex 1001, input/output circuits 1003, memory circuit 1002, and other circuits in computer system 1000. In various embodiments, power management unit 1006 may include one or more voltage regulator circuits, such as, e.g., a buck regulator circuit, configured to generate the regulated voltage level based on an external power supply (not shown). In some embodiments any suitable number of regulated voltage levels may be generated. Additionally, power management unit 1006 may include various circuits for managing distribution of one or more power signals to the various circuits in computer system 1000, including maintaining and adjusting voltage levels of these power signals. Power management unit 1006 may include circuits for monitoring power usage by computer system 1000, including determining or estimating power usage by particular circuits.

It is noted that the embodiment illustrated in FIG. 10 includes one example of a computer system. A limited number of circuit blocks are illustrated for simplicity. In other embodiments, any suitable number and combination of circuit blocks may be included. For example, in other embodiments, security and/or cryptographic circuit blocks may be included.

Figure 11:
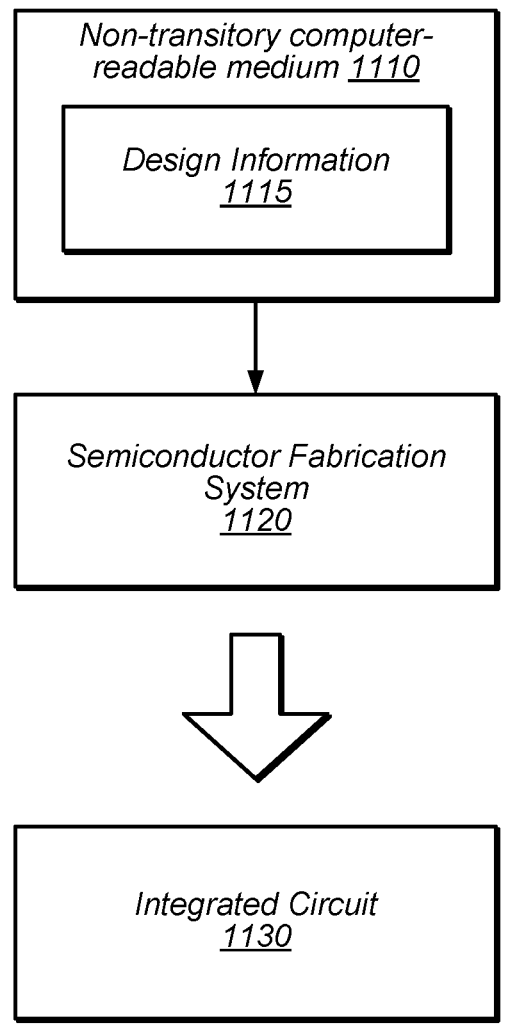
FIG. 11 illustrates a block diagram depicting an example computer-readable medium, according to some embodiments.

FIG. 11 is a block diagram illustrating an example of a non-transitory computer-readable storage medium that stores circuit design information, according to some embodiments. The embodiment of FIG. 11 may be utilized in a process to design and manufacture integrated circuits, such as, for example, an IC that includes computer system 1000 of FIG. 10. In the illustrated embodiment, semiconductor fabrication system 1120 is configured to process the design information 1115 stored on non-transitory computer-readable storage medium 1110 and fabricate integrated circuit 1130 based on the design information 1115.

Non-transitory computer-readable storage medium 1110, may comprise any of various appropriate types of memory devices or storage devices. Non-transitory computer-readable storage medium 1110 may be an installation medium, e.g., a CD-ROM, floppy disks, or tape device; a computer system memory or random-access memory such as DRAM, DDR RAM, SRAM, EDO RAM, Rambus RAM, etc.; a non-volatile memory such as a Flash, magnetic media, e.g., a hard drive, or optical storage; registers, or other similar types of memory elements, etc. Non-transitory computer-readable storage medium 1110 may include other types of non-transitory memory as well or combinations thereof. Non-transitory computer-readable storage medium 1110 may include two or more memory mediums which may reside in different locations, e.g., in different computer systems that are connected over a network.

Design information 1115 may be specified using any of various appropriate computer languages, including hardware description languages such as, without limitation: VHDL, Verilog, SystemC, SystemVerilog, RHDL, M, MyHDL, etc. Design information 1115 may be usable by semiconductor fabrication system 1120 to fabricate at least a portion of integrated circuit 1130. The format of design information 1115 may be recognized by at least one semiconductor fabrication system, such as semiconductor fabrication system 1120, for example. In some embodiments, design information 1115 may include a netlist that specifies elements of a cell library, as well as their connectivity. One or more cell libraries used during logic synthesis of circuits included in integrated circuit 1130 may also be included in design information 1115. Such cell libraries may include information indicative of device or transistor level netlists, mask design data, characterization data, and the like, of cells included in the cell library.

Integrated circuit 1130 may, in various embodiments, include one or more custom macrocells, such as memories, analog or mixed-signal circuits, and the like. In such cases, design information 1115 may include information related to included macrocells. Such information may include, without limitation, schematics capture database, mask design data, behavioral models, and device or transistor level netlists. As used herein, mask design data may be formatted according to graphic data system (gdsii), or any other suitable format.

Semiconductor fabrication system 1120 may include any of various appropriate elements configured to fabricate integrated circuits. This may include, for example, elements for depositing semiconductor materials (e.g., on a wafer, which may include masking), removing materials, altering the shape of deposited materials, modifying materials (e.g., by doping materials or modifying dielectric constants using ultraviolet processing), etc. Semiconductor fabrication system 1120 may also be configured to perform various testing of fabricated circuits for correct operation.

In various embodiments, integrated circuit 1130 is configured to operate according to a circuit design specified by design information 1115, which may include performing any of the functionality described herein. For example, integrated circuit 1130 may include any of various elements shown or described herein. Further, integrated circuit 1130 may be configured to perform various functions described herein in conjunction with other components. Further, the functionality described herein may be performed by multiple connected integrated circuits.

As used herein, a phrase of the form "design information that specifies a design of a circuit configured to . . . " does not imply that the circuit in question must be fabricated in order for the element to be met. Rather, this phrase indicates that the design information describes a circuit that, upon being fabricated, will be configured to perform the indicated actions or will include the specified components.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. An apparatus, comprising:
a communication bus configured to transfer a particular data payload that includes up to a maximum number of data words, and a control signal that indicates whether the particular data payload includes a mask value, the mask value indicative of enabled and non-enabled data words in the particular data payload; and
a decoding circuit configured to:
  receive, from an encoding circuit via the communication bus, the particular data payload and the control signal;
  in response to a determination that the control signal indicates that the particular data payload does not include the mask value, use a default value for the mask value; and
  create an uncompressed data payload from the particular data payload using the default value, wherein the default value causes the decoding circuit to maintain positions of data words between the particular data payload and the uncompressed data payload.

2. The apparatus of claim 1, wherein the decoding circuit includes a multiplexing circuit configured to:
select, using the control signal, either a particular data word of the particular data payload or the default value; and
generate the mask value based on the selection.

3. The apparatus of claim 2, wherein the decoding circuit includes a plurality of additional multiplexing circuits, individual ones of the plurality configured to:
select from the particular data payload, based on the control signal and the mask value, either a respective shifted data word or a respective unshifted data word; and generate a respective data word of the uncompressed data payload based on the selection.

4. The apparatus of claim 1, wherein the default value of the mask value includes a plurality of bits, wherein a given bit corresponds to a respective data word in the particular data payload, and wherein a value of the given bit indicates the respective data word is enabled.

5. The apparatus of claim 1, wherein the decoding circuit is further configured to send an indication to an associated functional circuit that the uncompressed data payload is ready to be retrieved.

6. The apparatus of claim 1, wherein the communication bus comprises a number of conductive traces corresponding to a number of bits included in the maximum number of data words plus the control signal, and wherein to receive the particular data payload via the communication bus, the decoding circuit is configured to receive the particular data payload and the control signal in parallel.

7. A method comprising:
receiving, by a decoding circuit from an encoding circuit, a particular data payload that includes a maximum number of data words;
receiving, by the decoding circuit from the encoding circuit, a control signal indicating whether the particular data payload includes a mask value, the mask value indicating ones of the data words in the particular data payload that are enabled and ones of the data words that are non-enabled;
in response to determining that the control signal indicates that the particular data payload does not include the mask value, using a default value for the mask value; and
creating, using the default value and the particular data payload, an uncompressed data payload, wherein the default value indicates that positions of data words between the particular data payload and the uncompressed data payload remain the same.

8. The method of claim 7, wherein using the default value for the mask value includes selecting, via a multiplexing circuit using the control signal, the default value as the mask value.

9. The method of claim 8, wherein creating a particular data word of the uncompressed data payload includes selecting from the particular data payload, based on the control signal and the mask value, either a respective shifted data word or a respective unshifted data word as the particular data word.

10. The method of claim 7, further comprising:
receiving, by the decoding circuit, a different data payload and a different control signal; and
in response to determining that the control signal indicates that the particular data payload includes the mask value, extracting the mask value from the different data payload.

11. The method of claim 10, wherein extracting the mask value from the different data payload includes selecting, via a multiplexing circuit using the control signal, a particular data word of the different data payload as the mask value.

12. The method of claim 7, further comprising sending, by the decoding circuit, an indication to an associated functional circuit that the uncompressed data payload is ready to be retrieved.

13. The method of claim 7, further comprising receiving, by the decoding circuit, the particular data payload and the control signal in parallel.

14. An integrated circuit, comprising:
a communication bus configured to transfer a data payload that includes a control signal and up to a maximum number of data words;
a decoding circuit coupled to the communication bus; and
an encoding circuit configured to:
receive an uncompressed data payload and a mask value, wherein the mask value indicates enabled and non-enabled data words in the uncompressed data payload; and
create, using the mask value, the control signal that indicates whether the uncompressed data payload includes one or more non-enabled data words;
create, using the mask value, a particular data payload from the uncompressed data payload;
determine, based on the control signal, whether to include the mask value in the particular data payload; and
send, via the communication bus, the particular data payload to the decoding circuit.

15. The integrated circuit of claim 14, wherein the encoding circuit is further configured to
in response to a determination that the control signal indicates that the uncompressed data payload includes one or more non-enabled data words, to include the mask value in the particular data payload; and
otherwise to exclude the mask value from the particular data payload.

16. The integrated circuit of claim 14, wherein the encoding circuit includes a multiplexing circuit configured to:
select, using the control signal, either a particular data word of the particular data payload or the mask value; and
store the selection in the particular data payload.

17. The integrated circuit of claim 16, wherein the encoding circuit includes a plurality of additional multiplexing circuits, individual ones of the plurality configured to:
select from the uncompressed data payload, based on the control signal and the mask value, either a respective shifted data word or a respective unshifted data word; and
store the respective selection in the particular data payload.

18. The integrated circuit of claim 14, wherein the mask value includes a plurality of bits, wherein a given bit corresponds to a respective data word in the uncompressed data payload, and wherein a value of the given bit indicates whether the respective data word is enabled or non-enabled.

19. The integrated circuit of claim 14, wherein decoding circuit is configured to:
receive the particular data payload and the control signal; and
in response to a determination that the control signal indicates that the particular data payload does not include the mask value, use a default value for the mask value.

20. The integrated circuit of claim 14, wherein the communication bus comprises a number of conductive traces corresponding to a number of bits included in the maximum number of data words plus the control signal, and wherein to send the particular data payload via the communication bus, the encoding circuit is configured to send the particular data payload and the control signal in parallel.

\* \* \* \* \*